(12) United States Patent
Querbach et al.

(10) Patent No.: US 9,691,492 B1
(45) Date of Patent: Jun. 27, 2017

(54) DETERMINATION OF DEMARCATION VOLTAGE FOR MANAGING DRIFT IN NON-VOLATILE MEMORY DEVICES

(71) Applicant: INTEL CORPORATION, Santa Clara, CA (US)

(72) Inventors: Bruce Querbach, Hillsboro, OR (US); Zion S. Kwok, Vancouver (CA); Christopher F. Connor, Hillsboro, OR (US); Philip Hillier, Rancho Santa Margarita, CA (US); Jeffrey W. Ryden, Tustin, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/280,669

(22) Filed: Sep. 29, 2016

(51) Int. Cl.
| | | |
|---|---|---|
| *G11C 5/14* | (2006.01) | |
| *G11C 16/28* | (2006.01) | |
| *G11C 16/10* | (2006.01) | |
| *G11C 16/30* | (2006.01) | |

(52) U.S. Cl.
CPC .............. *G11C 16/28* (2013.01); *G11C 16/10* (2013.01); *G11C 16/30* (2013.01)

(58) Field of Classification Search
USPC .......................... 365/189.09, 189.14, 189.15
See application file for complete search history.

(56) References Cited

U.S. PATENT DOCUMENTS

| | | | | |
|---|---|---|---|---|
| 5,931,951 | A * | 8/1999 | Ando | ..................... G06F 1/3228 711/141 |
| 2010/0174846 | A1* | 7/2010 | Paley | .................. G06F 12/0246 711/103 |
| 2011/0194347 | A1* | 8/2011 | Chae | .................... G11C 11/5628 365/185.03 |

* cited by examiner

*Primary Examiner* — Vu Le
(74) *Attorney, Agent, or Firm* — Konrad Raynes Davda & Victor LLP; Rabindranath Dutta

(57) ABSTRACT

A predetermined pattern of bits is written to a non-volatile memory device prior to powering down the non-volatile memory device. A plurality of voltages are applied to the non-volatile memory device to determine which voltage of the plurality of voltages allows the predetermined pattern of bits to be read with a least amount of error. The determined voltage is set to be a demarcation voltage for reading from the non-volatile memory device.

24 Claims, 10 Drawing Sheets

DETERMINATION OF DEMARCATION VOLTAGE FOR MANAGING DRIFT IN NON-VOLATILE MEMORY DEVICES

BACKGROUND

Volatile memory is a type of computer memory whose contents are erased when power to the volatile memory is turned off or interrupted. For example, dynamic random access memory (DRAM) is a type of volatile memory. Non-volatile memory is a type of computer memory that can retain stored information even after having been power cycled (i.e., turned off and then turned back on). In other words, non-volatile memory may store data persistently. Examples of non-volatile memory includes read-only memory (ROM), flash memory, etc.

A dual in-line memory module (DIMM) is a memory device that comprises a series of memory integrated circuits. Such modules may be mounted on a printed circuit board and may be designed for use in computational devices. A central processing unit (CPU) in a computational device may access the DIMM for performing read or write operations. DIMMs may be comprised of volatile or non-volatile memory integrated circuits.

A solid state drive (SSD) is a memory device that uses integrated circuit assemblies as memory to store data persistently. Many type of SSDs use NAND-based flash memory, where the NAND-based flash memory may retain data after being power cycled.

BRIEF DESCRIPTION OF THE DRAWINGS

Referring now to the drawings in which like reference numbers represent corresponding parts throughout.

DETAILED DESCRIPTION

In the following description, reference is made to the accompanying drawings which form a part hereof and which illustrate several embodiments. It is understood that other embodiments may be utilized and structural and operational changes may be made.

Once data is written to a non-volatile memory device, the voltage that needs to be applied to the non-volatile memory device to correctly read the data may increase over time. If instead of determining the appropriate voltage that needs to be applied to correctly read the data, a static voltage is used, then incorrect data is likely to be read. Also, when the non-volatile memory device is powered off and then subsequently powered on, then the appropriate voltage has to be applied to correctly read the data.

In certain embodiments, a predetermined pattern of bits is written to the non-volatile memory device prior to powering down the non-volatile memory device. A plurality of voltages are applied to the non-volatile memory device to determine which voltage of the plurality of voltages allows the predetermined pattern of bits to be read with a least amount of error. The voltage that is determined is set to be a demarcation voltage (i.e., a read reference voltage) that is used to correctly read data from the non-volatile memory device.

Figure 1:
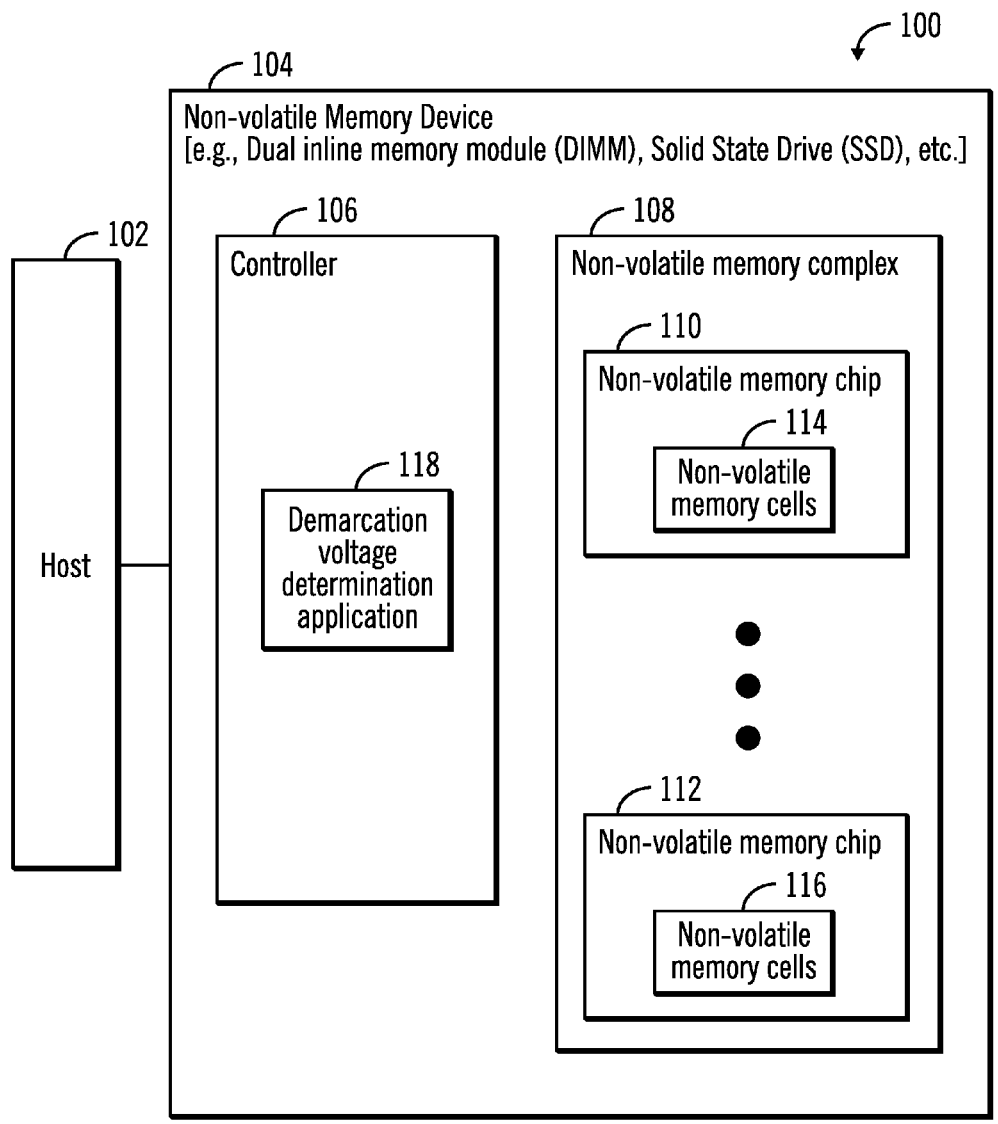
FIG. 1 illustrates a block diagram of a computing environment in which a host is coupled to a non-volatile memory device comprised of non-volatile memory, in accordance with certain embodiments.

FIG. 1 illustrates a block diagram of a computing environment 100 in which a host 102 writes data to a non-volatile memory device 104, in accordance with certain embodiments. The non-volatile memory device 104 may be comprised of a controller 106 and a non-volatile memory complex 108, where in certain embodiments the non-volatile memory complex 108 may be comprised of a plurality of non-volatile memory chips 110, 112 where each of the non-volatile memory chips 110, 112 may be comprised of a plurality of non-volatile memory cells 114, 116.

In certain embodiments, the controller 106 may be implemented via an application-specific integrated circuit (ASIC). In certain embodiments, the controller 106 may include a demarcation voltage determination application 118 that is implemented in hardware, software, firmware or any combination thereof. The demarcation voltage determination application 118 determines the voltage to be applied to the non-volatile memory chips 110, 112 to correctly read the data written to the non-volatile memory cells 114, 116.

In certain embodiments, the non-volatile memory device 104 may be a non-volatile memory DIMM that may in certain embodiments be comprised of non-volatile memory integrated circuits, where a non-volatile memory is a storage medium that does not require power to maintain the state of data stored by the storage medium. In certain embodiments the non-volatile memory DIMM may be comprised of a Triple Level Cell (TLC) NAND or any other type of NAND [e.g., Single Level Cell (SLC), Multi Level Cell (MLC), Quad Level Cell (QLC), etc.] or any other type of non-volatile memory. In other embodiments the non-volatile memory DIMM may be comprised of certain other types of non-volatile memory, such as NOR memory or some other suitable non-volatile memory. Nonlimiting examples of non-volatile memory may include any or a combination of: solid state memory [such as planar or three Dimensional (3D) NAND flash memory or NOR flash memory], storage devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), three dimensional (3D) crosspoint memory, ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, the 3D crosspoint memory may comprise a transistor-less stackable cross point architecture in which memory cells sit at the intersection of words lines and bit lines and are individually addressable and in which bit storage is based on a change in bulk resistance. In certain embodiments, a DIMM with non-volatile memory may comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at www.jedec.org). In certain embodiments, the non-volatile memory device 104 may be comprised of a solid state drive or any other type of device that includes non-volatile memory. It should be noted that a MINI or a solid state drive are examples of the non-volatile memory device 104, and the non-volatile memory device 104 may be comprised of any type of non-volatile memory.

In certain embodiments, the host 102 may be comprised of any suitable computational device, such as a personal computer, a mainframe, a telephony device, a smart phone, a storage controller, a blade computer, a processor with memory, etc. While FIG. 1 shows the non-volatile memory device 104 to be located outside the host 102, in certain embodiments, the non-volatile memory device 104 may be included within the host. In certain embodiments, the host 102 may communicate with the non-volatile memory device 104 over a bus (such as a Peripheral Component Interconnect (PCIe), Serial Advanced Technology Attachment (SATA), Serial Attached Small Computer System Interface (SAS)) or a network, such as the Internet, a storage area network (SAN), a local area network (LAN), etc.

Figure 2:
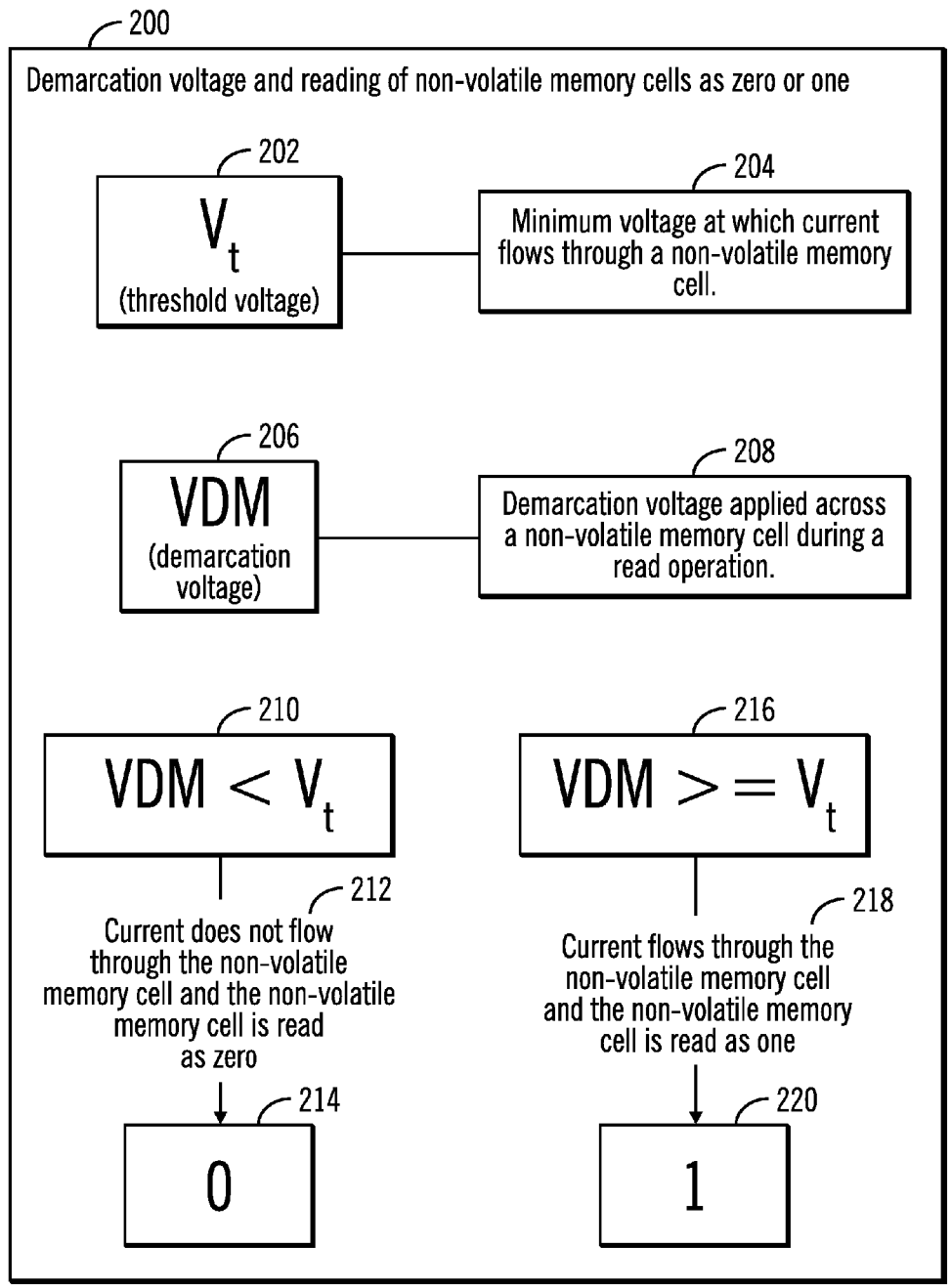
FIG. 2 illustrates a block diagram that shows how a demarcation voltage is applied to read data from a non-volatile memory cell, in accordance with certain embodiments.

FIG. 2 illustrates a block diagram 200 that shows how a demarcation voltage is applied to read data from a non-volatile memory cell, in accordance with certain embodiments. The demarcation voltage is defined to include any type of read reference voltage that is applied to read data from any type of non-volatile memory cell.

In FIG. 2, $V_t$ 202 is a threshold voltage that denotes the minimum voltage at which current flows through a non-volatile memory cell (as shown via reference numeral 204). Voltage demarcation (VDM) 206 denotes the demarcation voltage, where the demarcation voltage is applied across a non-volatile memory cell during a read operation that reads data from the non-volatile memory cell (as shown via reference numeral 208).

Block 210 shows the condition in which the demarcation voltage applied to a non-volatile memory cell is less than the threshold voltage (i.e., VDM<$V_t$) In such a condition, current does not flow through the memory cell, and the non-volatile memory cell is read as zero (as shown via reference numerals 212, 214).

Block 216 shows the condition in which the demarcation voltage applied to a non-volatile memory cell is greater than or equal to the threshold voltage (i.e., VDM>=$V_t$). In such a condition, current flows through the memory cell, and the non-volatile memory cell is read as one (as shown via reference numerals 218, 220).

In alternative embodiments, when current flows through a non-volatile memory cell then the non-volatile memory cell is read as zero, and when current does not flow through a non-volatile memory cell then the non-volatile memory cell is read as one, where zero and one denote two different states of the non-volatile memory cell.

Figure 3:
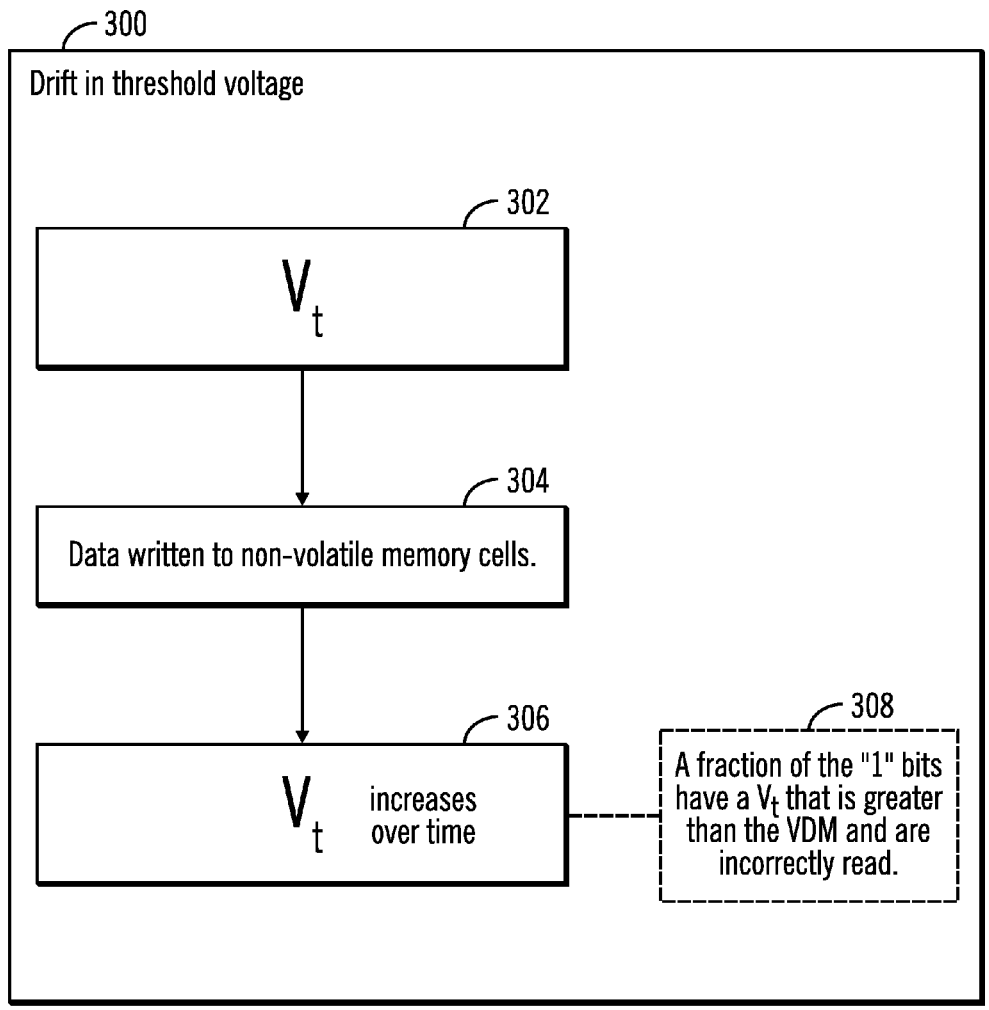
FIG. 3 illustrates a block diagram that shows how a threshold voltage increases over time for a non-volatile memory cell, in accordance with certain embodiments.

FIG. 3 illustrates a block diagram 300 that shows how a threshold voltage increases over time for a non-volatile memory cell, in accordance with certain embodiments. The increase over time of the threshold voltage is referred to as the drift of the threshold voltage.

Block 302 shows a plurality of memory cells whose threshold voltage is $V_t$, and data (i.e., zero or one) is written to each of the plurality of non-volatile memory cells (at block 304). After data is written to each of the plurality of non-volatile memory cells, the threshold voltage $V_t$ increases over time (as shown via reference numeral 306), where the increase in the threshold voltage may be different for different non-volatile memory cells. If the threshold voltage $V_t$ increases, then a fraction of the "1" bits of a plurality of non-volatile memory cells may have a $V_t$ that is greater than the demarcation voltage VDM, and these fraction of "1" bits are incorrectly read as zero when the demarcation voltage VDM is applied across the plurality of non-volatile memory cells.

Figure 4:
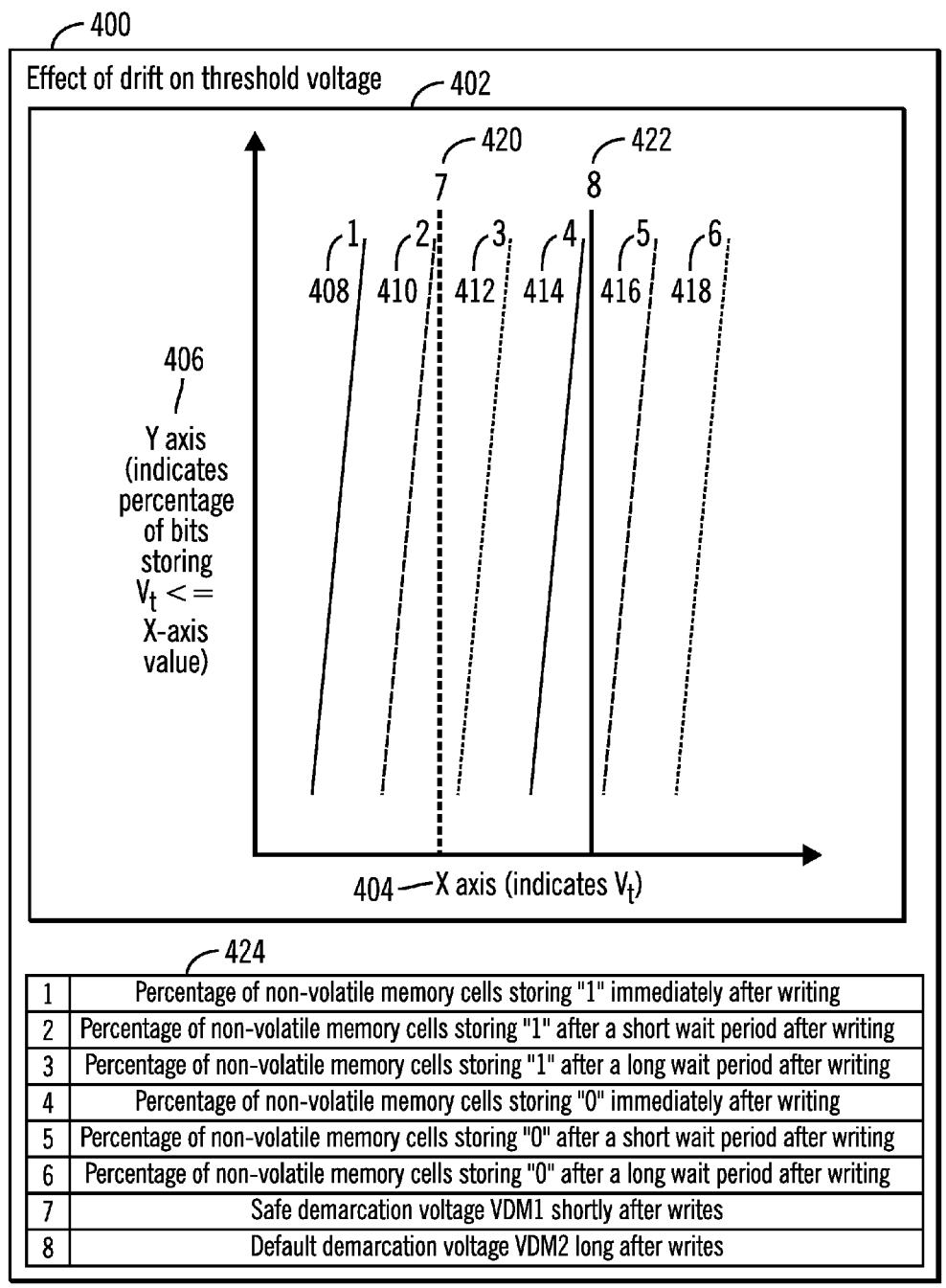
FIG. 4 illustrates a block diagram that shows the effect on drift on threshold voltage, in accordance with certain embodiments.

FIG. 4 illustrates a block diagram 400 that shows a graph 402 that shows the effect on drift on threshold voltage, in accordance with certain embodiments.

In FIG. 4, the X axis indicates the threshold voltage $V_t$ (reference numeral 404), and the Y axis indicates the percentage of bits in a plurality of non-volatile memory cells with the threshold voltage $V_t$ less than or equal to the X-axis value (reference numeral 406).

The lines labelled 1, 2, 3, 4, 5, 6, 7, 8 (shown via reference numerals 408, 410, 412, 414, 416, 418, 420, 422) that are shown in the graph 402 are described in the legend 424 shown in FIG. 4.

The line 1 (reference numeral 408) denotes the percentage of non-volatile memory cells with "1", immediately after writing to the non-volatile memory cells. The line 2 (reference numeral 410) denotes the percentage of non-volatile memory cells storing "1" after a short period has elapsed after writing to the non-volatile memory cells. The line 3 (reference numeral 412) denotes the percentage of non-volatile memory cells storing "1" after a long period has elapsed after writing to the non-volatile memory cells. The line 4 (reference numeral 414) denotes the percentage of non-volatile memory cells storing "0" immediately after writing to the non-volatile memory cells. The line 5 (reference numeral 416) denotes the percentage of non-volatile memory cells storing "0" after a short period has elapsed after writing to the non-volatile memory cells. The line 6 (reference numeral 418) denotes the percentage of non-volatile memory cells storing "0" after a long period has elapsed after writing to the non-volatile memory cells.

In the graph 402, line 7 (reference numeral 420) indicates a safe demarcation voltage VDM1 that should be used after a short period has elapsed after writing to the plurality of memory cells, as line 7 (shown via reference numeral 420) separates line 2 (reference numeral 410) and line 5 (reference numeral 416). If the controller 106 applies the safe demarcation voltage VDM1 to the plurality of non-volatile memory cells 114, 116 after the "short period" after writing, then data is read correctly from the plurality of non-volatile memory cells 114, 116.

In the graph 402, line 8 (reference numeral 422) indicates a safe demarcation voltage VDM2 that should be used after a long period has elapsed after writes to the plurality of memory cells, as line 8 (shown via reference numeral 422) separates line 3 (reference numeral 412) and line 6 (reference numeral 418). If the controller 106 applies the safe demarcation voltage VDM2 to the plurality of non-volatile memory cells 114, 116 after the "long period" after writing, then data is read correctly from the plurality of non-volatile memory cells 114, 116.

Therefore, FIG. 4 shows that demarcation voltage VDM2 that is used after a long period after writing to non-volatile memory cells is greater than the demarcation voltage VDM1 that is used after a short period after writing to non-volatile memory cells. In certain embodiments, VDM1 and VDM2 may be determined experimentally or via modeling and simulation of a non-volatile memory device, and may be stored in non-volatile memory at the time of manufacture of the non-volatile memory device.

Figure 5:
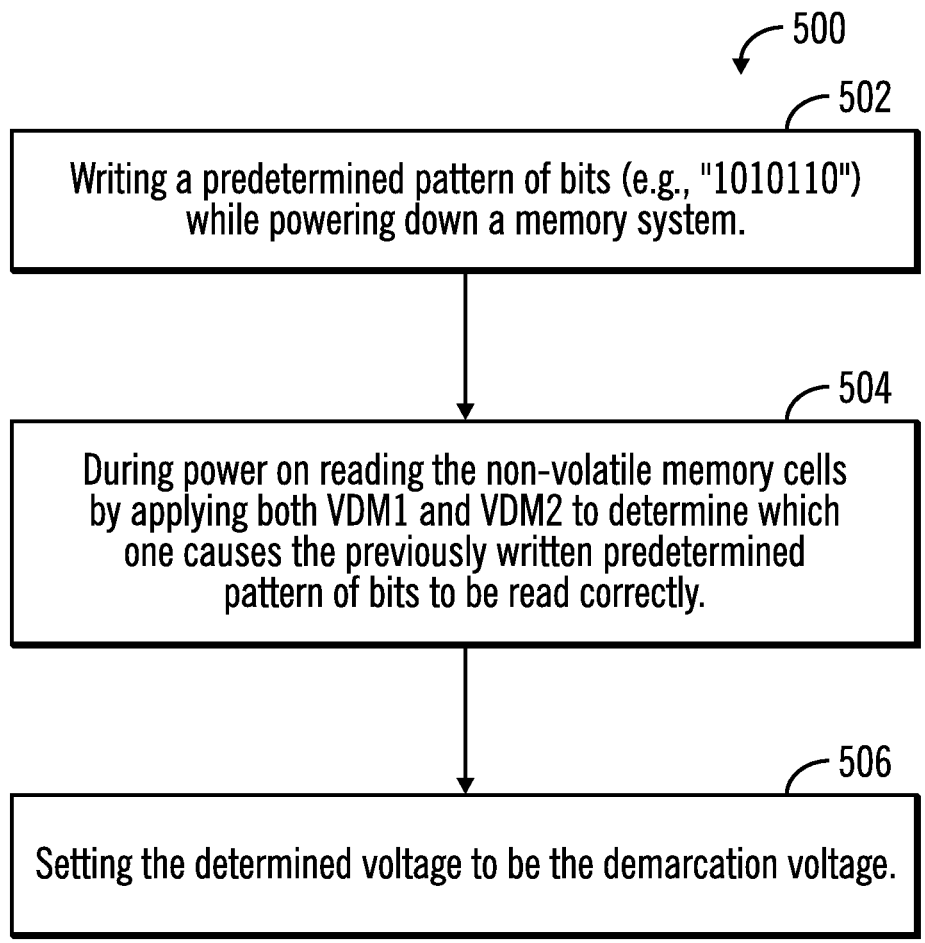
FIG. 5 illustrates a flowchart that shows first operations for setting a demarcation voltage, in accordance with certain embodiments.

FIG. 5 illustrates a flowchart 500 that shows first operations for setting a demarcation voltage, in accordance with certain embodiments. The operations shown in FIG. 5 may be performed by the demarcation voltage determination application 118 that executes in the controller 106 of the non-volatile memory device 104.

Control starts at block 502 in which the demarcation voltage determination application 118 writes a predetermined pattern of bits e.g., "1010110" or some other pattern of a fixed length) while powering down a memory system, such as the non-volatile memory device 104 or a non-volatile memory chip (e.g., 110, 112). Subsequent to writing the predetermined pattern of bits, the memory system is powered off and then powered on again. During or immediately after powering on the memory system, the demarcation voltage determination application 118 reads the non-volatile memory cells by applying both demarcation voltages VDM1 and VDM2 (described in FIG. 4) to determine which one causes the previously written predetermined pattern of bits to be read correctly (at block 504), Control proceeds to block 506 in which the demarcation voltage determination application 118 sets the determined voltage (VDM1 or VDM2) to be the demarcation voltage. Therefore, in FIG. 5 the demarcation voltage is determined to be either VDM1 or VDM2 but not both.

Figure 6:
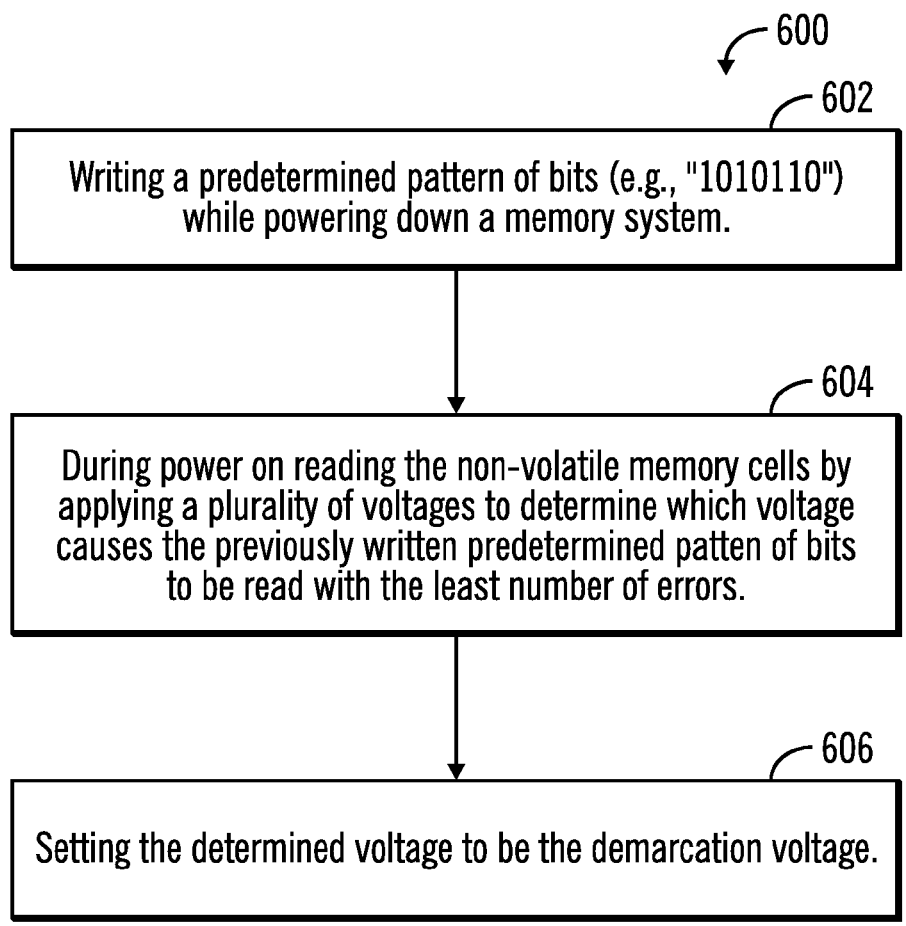
FIG. 6 illustrates a flowchart that shows second operations for setting a demarcation voltage, in accordance with certain embodiments.

FIG. 6 illustrates a flowchart 600 that shows second operations for setting a demarcation voltage, in accordance with certain embodiments. The operations shown in FIG. 6 may be performed by the demarcation voltage determination application 118 that executes in the controller 106 of the non-volatile memory device 104.

Control starts at block 602 in which the demarcation voltage determination application 118 writes a predetermined pattern of bits (e.g., "1010110" or some other pattern of a fixed length) while powering down a memory system, such as the non-volatile memory device 104 or a non-volatile memory chip (e.g., 110, 112). Subsequent to writing the predetermined pattern of bits, the memory system is powered off and then powered on again. During or immediately after powering on the memory system, the demarcation voltage determination application 118 reads the non-volatile memory cells by applying a plurality of voltages to determine which voltage causes the previously written predetermined pattern of bits to be read with the least number of errors (at block 604). Control proceeds to block 606 in which the demarcation voltage determination application 118 sets the determined voltage to be the demarcation voltage. Therefore, in FIG. 5 the demarcation voltage is the applied voltage that reads the predetermined pattern with the least amount of errors. It should be noted that the greater the number of the plurality of voltages that are applied the better is the determination of the demarcation voltage. However, applying many voltages for determining the demarcation voltage may be more time consuming than applying a few voltages.

Figure 7:
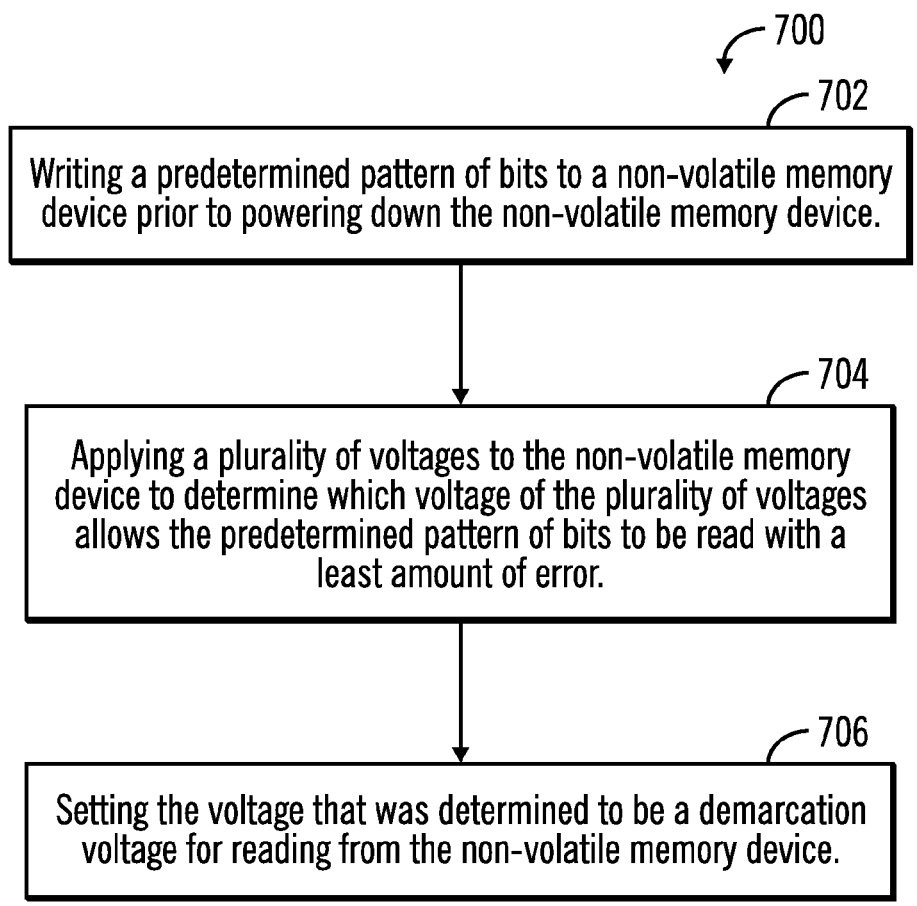
FIG. 7 illustrates a flowchart that shows third operations for setting a demarcation voltage, in accordance with certain embodiments.

FIG. 7 illustrates a flowchart 700 that shows third operations for setting a demarcation voltage, in accordance with certain embodiments. The operations shown in FIG. 7 may be performed by the demarcation voltage determination application 118 that executes in the controller 106 of the non-volatile memory device 104.

Control starts at block 702, in which a predetermined pattern of bits is written to a non-volatile memory device prior to powering down the non-volatile memory device. A plurality of voltages are applied (at block 704) to the non-volatile memory device to determine which voltage of the plurality of voltages allows the predetermined pattern of bits to be read with a least amount of error. The determined voltage is set (at block 708) to be a demarcation voltage for reading from the non-volatile memory device.

Figure 8:
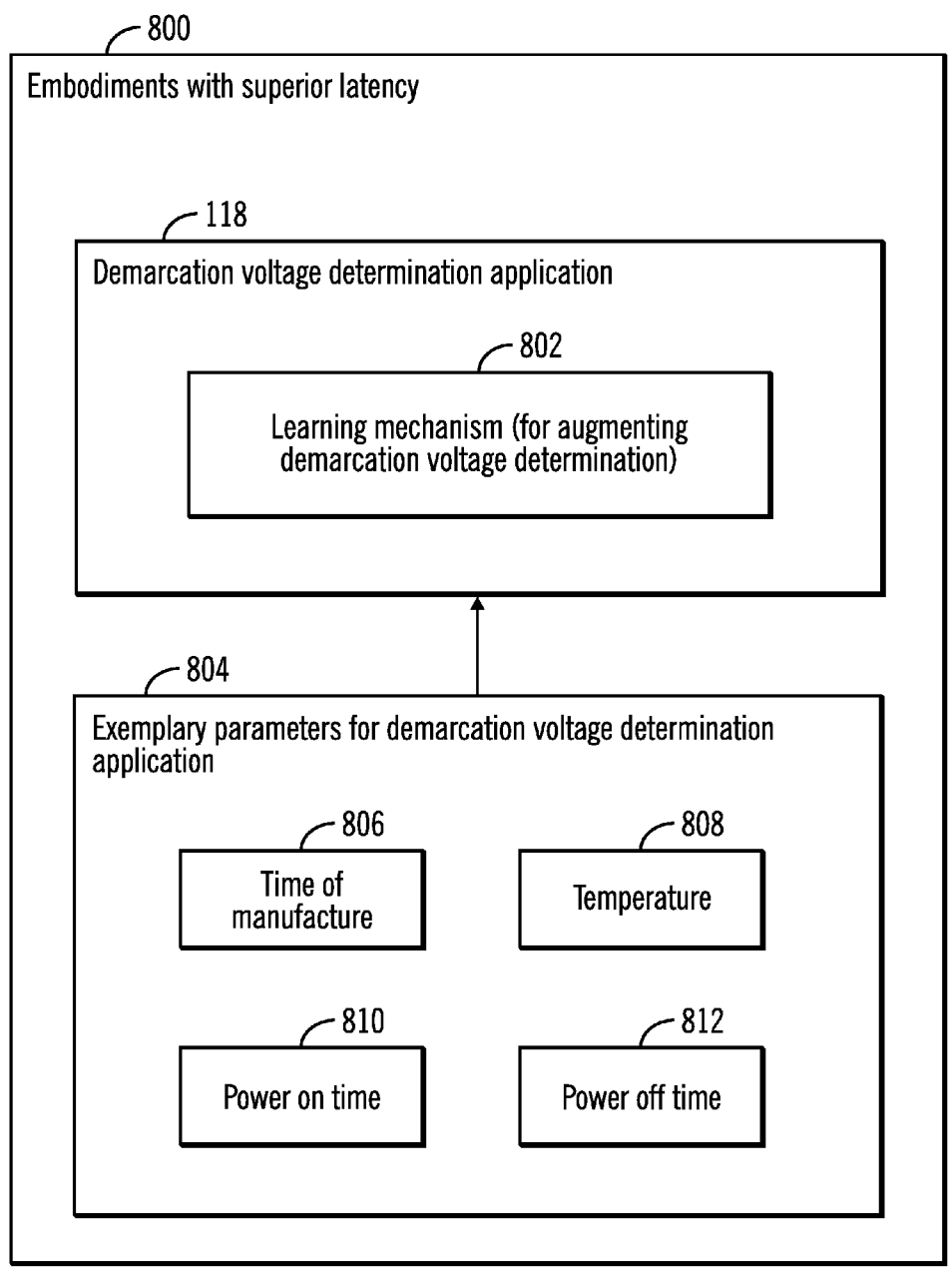
FIG. 8 illustrates a block diagram that shows a mechanism for improving latency in determining demarcation voltage, in accordance with certain embodiments.

FIG. 8 illustrates a block diagram 800 that shows embodiments that provide improved latency for determining demarcation voltage, in accordance with certain embodiments. The demarcation voltage determination application 118 may include a learning mechanism 602 that augments the demarcation voltage determination application 118. The learning mechanism 802 may use the parameters 804, such as the time of manufacture 806 of a non-volatile memory device, the temperature 808 at which the non-volatile memory device operates, the power on time 810 of the non-volatile memory device, and the power off time of the non-volatile memory device, to determine the plurality of voltages to apply to determine which voltage should be set to the demarcation voltage.

Figure 9:
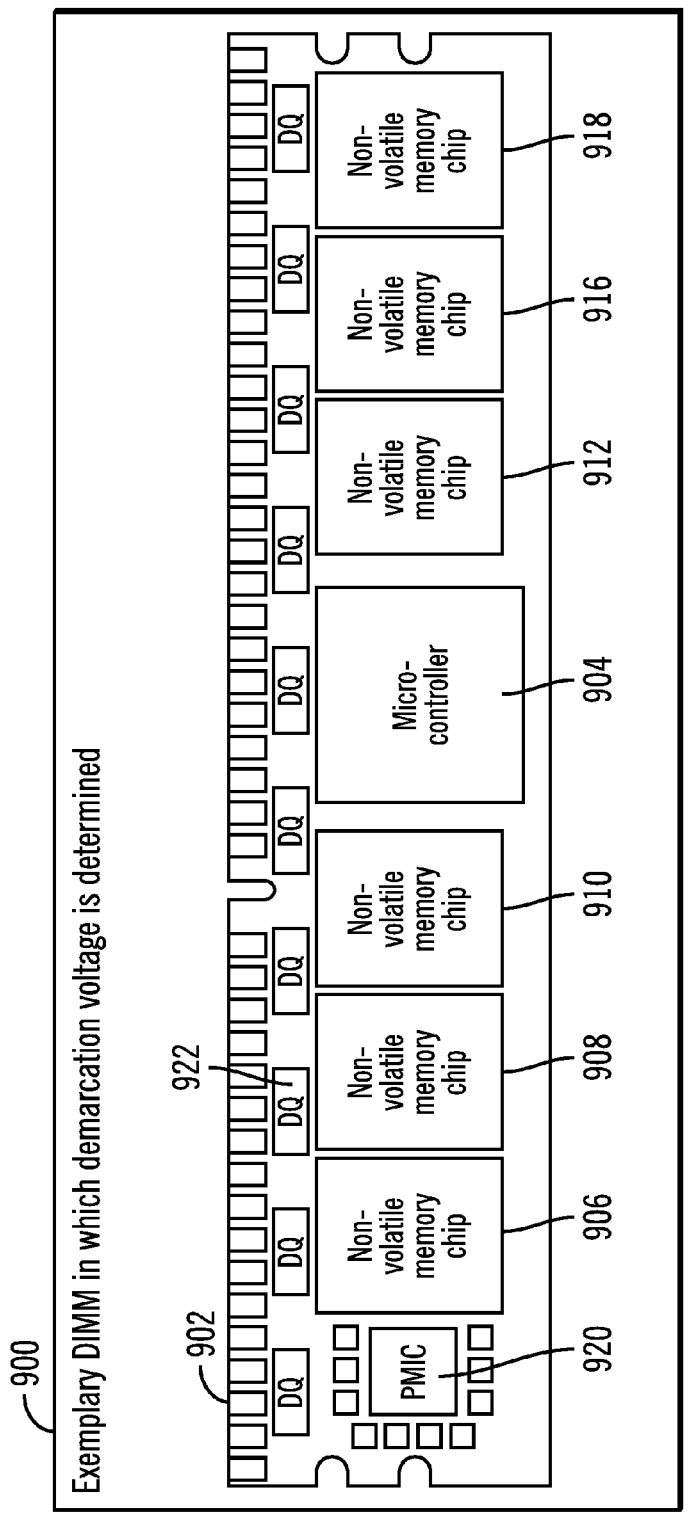
FIG. 9 illustrates a block diagram of a dual inline memory module (DIMM) in which demarcation voltage is determined, in accordance with certain embodiments.

FIG. 9 illustrates a block diagram 900 of a DIMM 902 in which demarcation voltage is determined, in accordance with certain embodiments. The DIMM may correspond to the non-volatile memory device 104 shown in FIG. 1.

The DIMM 902 may include a micro-controller 904 that corresponds to the controller 106 shown in FIG. 1. The DIMM 902 may also include a plurality of non-volatile memory chips 906, 908, 910, 912, 914, 916. The DIMM 902 also includes a power management controller 920 and data buffers, such as data buffer 922. The non-volatile memory chips 906, 908, 910, 912, 914, 916 may correspond to the plurality of non-volatile memory chips 110, 112 included in the non-volatile memory device 104 shown in FIG. 1 and the demarcation voltage may be determined by the micro-controller 904 of the DIMM 902.

Therefore, FIGS. 1-9 illustrate certain embodiments for determining the demarcation voltage for reading data correctly from non-volatile memory, when the threshold voltage for reading 0's and 1's change over time after writing to the non-volatile memory. Learning mechanisms may be used to determine what voltages to apply to determine the demarcation voltage.

The described operations may be implemented as a method, apparatus or computer program product using standard programming and/or engineering techniques to produce software, firmware, hardware, or any combination thereof The described operations may be implemented as code maintained in a "computer readable storage medium", where a processor may read and execute the code from the computer storage readable medium. The computer readable storage medium includes at least one of electronic circuitry, storage materials, inorganic materials, organic materials, biological materials, a casing, a housing, a coating, and hardware. A computer readable storage medium may comprise, but is not limited to, a magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), Solid State Devices (SSD), etc. The code implementing the described operations may further be implemented in hardware logic implemented in a hardware device (e.g., an integrated circuit chip, Programmable Gate Array (PGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer. A computer readable storage medium is not comprised solely of transmission signals. Those skilled in the art will recognize that many modifications may be made to this configuration, and that the article of manufacture may comprise suitable information bearing medium known in the art.

Computer program code for carrying out operations for aspects of the certain embodiments may be written in any combination of one or more programming languages. Blocks of the flowchart and block diagrams may be implemented by computer program instructions.

Figure 10:
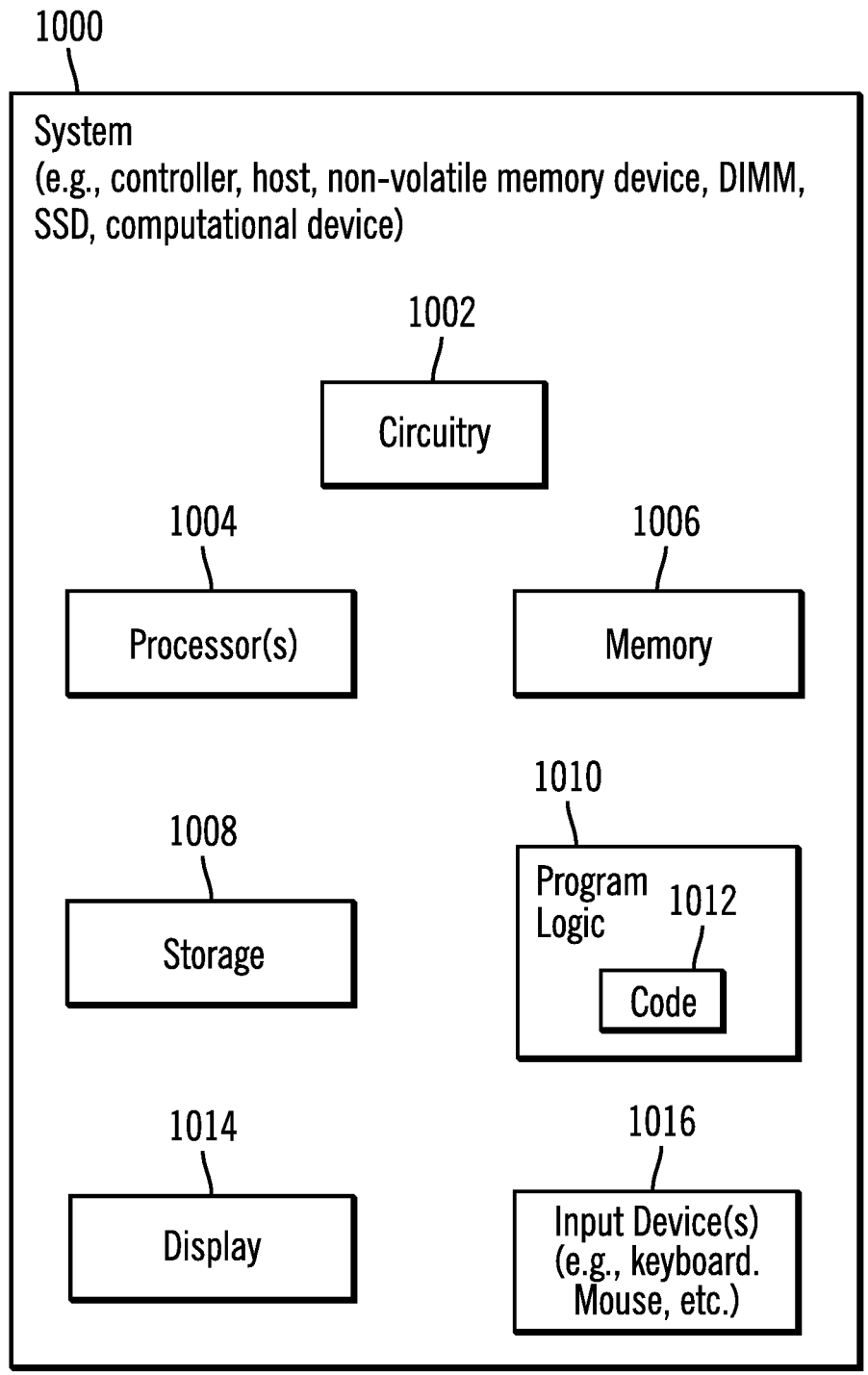
FIG. 10 illustrates a block diagram of a system comprising a controller, a host, a non-volatile memory device, a DIMM, an SSD, or a computational device, in accordance with certain embodiments.

FIG. 10 illustrates a block diagram of a system 1000 that corresponds to the controller 106, the host 102, the non-volatile memory device 104, a DIMM, an SSD, or a computational device, in accordance with certain embodiments. For example, in certain embodiments the system 1000 may be a computer (e.g., a laptop computer, a desktop computer, a tablet, a cell phone or any other suitable computational device) that has the host 102 and the non-volatile memory device 104 both included in the system 1000. For example, in certain embodiments the system 1000 be a laptop computer that includes the non-volatile memory device 104. The system 1000 may include a circuitry 1002 that may in certain embodiments include at least a processor 1004. The system 1000 may also include a memory 1006 (e.g., a volatile memory device , and storage 1008. The storage 1008 may include the non-volatile memory device 104 or other drives or devices including a non-volatile memory device e.g., EEPROM, ROM, PROM, flash, firmware, programmable logic, etc.), The storage 1008 may also include a magnetic disk drive, an optical disk drive, a tape drive, etc. The storage 1008 may comprise an internal storage device, an attached storage device and/or a network accessible storage device. The system 1000 may include a program logic 1010 including code 1012 that may be loaded into the memory 1006 and executed by the processor 1004 or circuitry 1002. In certain embodiments, the program logic 1010 including code 1012 may be stored in the storage 1008. In certain other embodiments, the program logic 1010 may be implemented in the circuitry 1002. Therefore, while FIG. 10 shows the program logic 1010 separately from the other elements, the program logic 1010 may be implemented in the memory 1006 and/or the circuitry 1002. The system 1000 may also include a display 1014 (e.g., an liquid crystal display (LCD), a light emitting diode (LED) display, a cathode ray tube (CRT) display, a touchscreen display, or any other suitable display), The system 1000 may also include one or more input devices 1016, such as, a keyboard, a mouse, a joystick, a trackpad, or any other suitable input devices. Other components or devices beyond those shown in FIG. 10 may also he found in the system 1000.

Certain embodiments may be directed to a method for deploying computing instruction by a person or automated processing integrating computer-readable code into a computing system, wherein the code in combination with the computing system is enabled to perform the operations of the described embodiments.

The terms "an embodiment", "embodiment", "embodiments", the "embodiment", "the embodiments", "one or more embodiments", "some embodiments", and "one embodiment" mean "one or more (but not all) embodiments" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features, Thus, other embodiments need not include the device itself.

At least certain operations that may have been illustrated in the figures show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to be limited to the precise forms disclosed. Many modifications and variations are possible in light of the above teaching.

EXAMPLES

The following examples pertain to further embodiments.

Example 1 is a method for controlling drift, wherein the method comprises: writing a predetermined pattern of bits to a non-volatile memory device prior to powering down the non-volatile memory device; applying a plurality of voltages to the non-volatile memory device to determine which voltage of the plurality of voltages allows the predetermined pattern of bits to be read with a least amount of error; and setting, the determined voltage to be a demarcation voltage for reading from the non-volatile memory device.

In example 2, the subject matter of example 1 may include that the non-volatile memory device is comprised of a plurality of non-volatile memory cells, and wherein if current flows through a non-volatile memory cell on applying the demarcation voltage then a first state is read from the non-volatile memory cell, and if current does not flow though the non-volatile memory cell on applying the demarcation voltage then a second state is read from the non-volatile memory cell.

In example 3, the subject matter of example 2 may include that the first state that is read corresponds to one and the second state that is read corresponds to zero, and wherein the predetermined pattern of bits is written to the non-volatile memory device, in response to initiating a process to power down the non-volatile memory device.

In example 4, the subject matter of example 3 may include that the non-volatile memory device is powered up subsequent to the powering down of the non-volatile memory device.

In example 5, the subject matter of example 1 may include that the plurality of voltage that are applied include a first voltage and a second voltage, wherein the second voltage is greater than the first voltage, wherein the first voltage is determined to be the demarcation voltage if a time duration between a powering down and a powering up of the non-volatile memory device is relatively small, and wherein the second voltage is determined to be the demarcation voltage if the time duration between the powering down and the powering up of the non-volatile memory device is relatively large.

In example 6, the subject matter of example 1 may include that the voltage to be applied to correctly read a previously written bit increases over time.

In example 7, the subject matter of example 1 may include that at least one of a time of manufacture, a temperature, a power on time, and a power off time are also used for determining the demarcation voltage.

In example 8, the subject matter of example 1 may include that the demarcation voltage is a read reference voltage, wherein the non-volatile memory device includes a plurality of non-volatile memory cells.

Example 9 is a non-volatile memory device for controlling drift, the non-volatile memory device comprising: a non-volatile memory; and a controller coupled to the non-volatile memory, wherein the controller is operable to: write a predetermined pattern of bits to the non-volatile memory device prior to powering down the non-volatile memory device; apply a plurality of voltages to the non-volatile memory device to determine which voltage of the plurality of voltages allows the predetermined pattern of bits to be read with a least amount of error; and set the determined voltage to be a demarcation voltage for reading from the non-volatile memory device.

In example 10, the subject matter of example 9 may include that the non-volatile memory is comprised of a plurality of non-volatile memory cells, and wherein if current flows through a non-volatile memory cell on applying the demarcation voltage then a first state is read from the non-volatile memory cell, and if current does not flow though the non-volatile memory cell on applying the demarcation voltage then a second state is read from the non-volatile memory cell.

In example 11, the subject matter of example 10 may include that the first state that is read corresponds to one and the second state that is read corresponds to zero, and wherein the predetermined pattern of bits is written to the non-volatile memory device, in response to initiating a process to power down the non-volatile memory device.

In example 12, the subject matter of example 11 may include that the non-volatile memory device is powered up subsequent to the powering down of the non-volatile memory device.

In example 13, the subject matter of example 9 may include that the plurality of voltage that are applied include a first voltage and a second voltage, wherein the second voltage is greater than the first voltage, wherein the first voltage is determined to be the demarcation voltage if a time duration between a powering down and a powering up of the non-volatile memory device is relatively small, and wherein the second voltage is determined to be the demarcation voltage if the time duration between the powering down and the powering up of the non-volatile memory device is relatively large.

In example 14, the subject matter of example 9 may include that the voltage to be applied to correctly read a previously written bit increases over time.

In example 15, the subject matter of example 9 may include that at least one of a time of manufacture, a temperature, a power on time, and a power off time are also used for determining the demarcation voltage.

In example 16, the subject matter of example 9 may include that the demarcation voltage is a read reference voltage, and wherein the non-volatile memory device comprises at least one of a dual inline memory module (DIMM) and a solid state drive (SSD).

Example 17 is a system for managing drift, the system comprising: a display; a non-volatile memory device comprising a non-volatile memory; and a controller coupled to the non-volatile memory, wherein the controller is operable to: write a predetermined pattern of bits to the non-volatile memory device prior to powering down the non-volatile memory device; apply a plurality of voltages to the non-volatile memory device to determine which voltage of the plurality of voltages allows the predetermined pattern of bits to be read with a least amount of error; and set the determined voltage to be a demarcation voltage for reading from the non-volatile memory device.

In example 18, the subject matter of example 18 may include that the non-volatile memory is comprised of a plurality of non-volatile memory cells, and wherein if current flows through a non-volatile memory cell on applying the demarcation voltage then a first state is read from the non-volatile memory cell, and if current does not flow though the non-volatile memory cell on applying the demarcation voltage then a second state is read from the non-volatile memory cell.

In example 19, the subject matter of example 18 may include that the first state that is read corresponds to one and the second state that is read corresponds to zero, and wherein the predetermined pattern of bits is written to the non-volatile memory device, in response to initiating a process to power down the non-volatile memory device.

In example 20, the subject matter of example 19 may include that the non-volatile memory device is powered up subsequent to the powering down of the non-volatile memory device.

In example 21, the subject matter of example 17 may include that the plurality of voltage that are applied include a first voltage and a second voltage, wherein the second voltage is greater than the first voltage, wherein the first voltage is determined to be the demarcation voltage if a time duration between a powering down and a powering up of the non-volatile memory device is relatively small, and wherein the second voltage is determined to be the demarcation voltage if the time duration between the powering down and the powering up of the non-volatile memory device is relatively large.

In example 22, the subject matter of example 17 may include that the voltage to be applied to correctly read a previously written bit increases over time.

In example 23, the subject matter of example 17 may include that at least one of a time of manufacture, a temperature, a power on time, and a power off time are also used for determining the demarcation voltage.

In example 24, the subject matter of example 17 may include that the demarcation voltage is a read reference voltage, and wherein the non-volatile memory device comprises at least one of a dual inline memory module (DIMM) and a solid state drive (SSD).

Example 25 is a system for managing drift, the system comprising: means for writing a predetermined pattern of bits to a non-volatile memory device prior to powering down the non-volatile memory device; means for applying a plurality of voltages to the non-volatile memory device to determine which voltage of the plurality of voltages allows the predetermined pattern of bits to be read with a least amount of error; and means for setting, the determined voltage to be a demarcation voltage for reading from the non-volatile memory device.

What is claimed is:

1. A method comprising,
writing a predetermined pattern of bits to a non-volatile memory device prior to powering down the non-volatile memory device;
applying a plurality of voltages to the non-volatile memory device to determine which voltage of the plurality of voltages allows the predetermined pattern of bits to be read with a least amount of error; and
setting, the determined voltage to be a demarcation voltage for reading from the non-volatile memory device.

2. The method of claim 1, wherein the non-volatile memory device is comprised of a plurality of non-volatile memory cells, and wherein if current flows through a non-volatile memory cell on applying the demarcation voltage then a first state is read from the non-volatile memory cell, and if current does not flow though the non-volatile memory cell on applying the demarcation voltage then a second state is read from the non-volatile memory cell.

3. The method of claim 2, wherein the first state that is read corresponds to one and the second state that is read corresponds to zero, and wherein the predetermined pattern of bits is written to the non-volatile memory device, in response to initiating a process to power down the non-volatile memory device.

4. The method of claim 3, wherein the non-volatile memory device is powered up subsequent to the powering down of the non-volatile memory device.

5. The method of claim 1, wherein the plurality of voltages that are applied include a first voltage and a second voltage, wherein the second voltage is greater than the first voltage, wherein the first voltage is determined to be the demarcation voltage if a time duration between a powering down and a powering up of the non-volatile memory device is relatively small, and wherein the second voltage is determined to be the demarcation voltage if the time duration between the powering down and the powering up of the non-volatile memory device is relatively large.

6. The method of claim 1, wherein the voltage to be applied to correctly read a previously written bit increases over time.

7. The method of claim 1, wherein at least one of a time of manufacture, a temperature, a power on time, and a power off time are also used for determining the demarcation voltage.

8. The method of claim 1, wherein the demarcation voltage is a read reference voltage, and wherein the non-volatile memory device includes a plurality of non-volatile memory cells.

9. A non-volatile memory device, comprising:
a non-volatile memory; and
a controller coupled to the non-volatile memory, wherein the controller is operable to:
write a predetermined pattern of bits to the non-volatile memory device prior to powering down the non-volatile memory device;
apply a plurality of voltages to the non-volatile memory device to determine which voltage of the plurality of voltages allows the predetermined pattern of bits to be read with a least amount of error; and
set the determined voltage to be a demarcation voltage for reading from the non-volatile memory device.

10. The non-volatile memory device of claim 9, wherein the non-volatile memory is comprised of a plurality of non-volatile memory cells, and wherein if current flows through a non-volatile memory cell on applying the demarcation voltage then a first state is read from the non-volatile memory cell, and if current does not flow though the non-volatile memory cell on applying the demarcation voltage then a second state is read from the non-volatile memory cell.

11. The non-volatile memory device of claim 10, wherein the first state that is read corresponds to one and the second state that is read corresponds to zero, and wherein the predetermined pattern of bits is written to the non-volatile memory device, in response to initiating a process to power down the non-volatile memory device.

12. The non-volatile memory device of claim 11, wherein the non-volatile memory device is powered up subsequent to the powering down of the non-volatile memory device.

13. The non-volatile memory device of claim 9, wherein the plurality of voltages that are applied include a first voltage and a second voltage, wherein the second voltage is greater than the first voltage, wherein the first voltage is determined to be the demarcation voltage if a time duration between a powering down and a powering up of the non-volatile memory device is relatively small, and wherein the second voltage is determined to be the demarcation voltage if the time duration between the powering down and the powering up of the non-volatile memory device is relatively large.

14. The non-volatile memory device of claim 9, wherein the voltage to be applied to correctly read a previously written bit increases over time.

15. The non-volatile memory device of claim 9, wherein at least one of a time of manufacture, a temperature, a power on time, and a power off time are also used for determining the demarcation voltage.

16. The non-volatile memory device of claim 9, wherein the demarcation voltage is a read reference voltage, and wherein the non-volatile memory device comprises at least one of a dual inline memory module (DIMM) and a solid state drive (SSD).

17. A system, comprising:
a display;
a non-volatile memory device comprising a non-volatile memory; and
a controller coupled to the non-volatile memory, wherein the controller is operable to:
write a predetermined pattern of bits to the non-volatile memory device prior to powering down the non-volatile memory device;
apply a plurality of voltages to the non-volatile memory device to determine which voltage of the plurality of voltages allows the predetermined pattern of bits to be read with a least amount of error; and
set the determined voltage to be a demarcation voltage for reading from the non-volatile memory device.

18. The system of claim 17, wherein the non-volatile memory is comprised of a plurality of non-volatile memory cells, and wherein if current flows through a non-volatile memory cell on applying the demarcation voltage then a first state is read from the non-volatile memory cell, and if current does not flow though the non-volatile memory cell on applying the demarcation voltage then a second state is read from the non-volatile memory cell.

19. The system of claim 18, wherein the first state that is read corresponds to one and the second state that is read corresponds to zero, and wherein the predetermined pattern of bits is written to the non-volatile memory device, in response to initiating a process to power down the non-volatile memory device.

20. The system of claim 19, wherein the non-volatile memory device is powered up subsequent to the powering down of the non-volatile memory device.

21. The system of claim 17, wherein the plurality of voltages that are applied include a first voltage and a second voltage, wherein the second voltage is greater than the first voltage, wherein the first voltage is determined to be the demarcation voltage if a time duration between a powering down and a powering up of the non-volatile memory device is relatively small, and wherein the second voltage is determined to be the demarcation voltage if the time duration between the powering down and the powering up of the non-volatile memory device is relatively large.

22. The system of claim 17, wherein the voltage to be applied to correctly read a previously written bit increases over time.

23. The system of claim 17, wherein at least one of a time of manufacture, a temperature, a power on time, and a power off time are also used for determining the demarcation voltage.

24. The system of claim 17, wherein the demarcation voltage is a read reference voltage, and wherein the non-volatile memory device comprises at least one of a dual inline memory module (DIMM) and a solid state drive (SSD).

* * * * *